United States Patent
Nakagawa et al.

(10) Patent No.: US 6,445,594 B1
(45) Date of Patent: Sep. 3, 2002

(54) SEMICONDUCTOR DEVICE HAVING STACKED SEMICONDUCTOR ELEMENTS

(75) Inventors: Kazuyuki Nakagawa; Michitaka Kimura, both of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/620,717

(22) Filed: Jul. 20, 2000

(30) Foreign Application Priority Data

Feb. 10, 2000 (JP) .......................................... 2000-033791

(51) Int. Cl.[7] .................................................. H05K 7/06
(52) U.S. Cl. ........................ 361/776; 361/783; 257/723; 257/777; 257/784; 257/786
(58) Field of Search .................................. 361/760, 767, 361/772, 776, 783; 257/668, 686, 723, 777, 784, 786; 174/52.4

(56) References Cited

U.S. PATENT DOCUMENTS

| | | | |
|---|---|---|---|
| 5,384,689 A | | 1/1995 | Shen ........................... 361/761 |
| 5,422,435 A | * | 6/1995 | Takiar et al. ................. 257/777 |
| 5,815,372 A | * | 9/1998 | Gallas ........................... 257/777 |
| 5,818,698 A | | 10/1998 | Corisis ......................... 361/760 |
| 5,894,410 A | * | 4/1999 | Barrow ........................ 361/783 |
| 5,917,242 A | * | 6/1999 | Ball ............................. 257/777 |
| 5,920,118 A | * | 7/1999 | Kong ........................... 257/778 |
| 5,973,403 A | * | 10/1999 | Wark ........................... 257/777 |
| 5,998,860 A | * | 12/1999 | Chan et al. .................. 257/723 |
| 6,100,594 A | * | 8/2000 | Fukui et al. ................. 257/777 |
| 6,133,626 A | * | 10/2000 | Hawke et al. ................ 257/777 |
| 6,157,080 A | * | 12/2000 | Tamaki et al. ............... 257/784 |
| 6,163,068 A | * | 12/2000 | Yao ............................. 257/723 |
| 6,181,002 B1 | * | 1/2001 | Juso et al. .................... 257/777 |
| 6,201,299 B1 | * | 3/2001 | Tao et al. ..................... 257/784 |
| 6,215,182 B1 | * | 4/2001 | Ozawa et al. ................ 257/723 |
| 6,218,731 B1 | * | 4/2001 | Huang et al. ................ 257/784 |
| 6,242,283 B1 | * | 6/2001 | Lo et al. ...................... 257/723 |

FOREIGN PATENT DOCUMENTS

| | | |
|---|---|---|
| JP | 60-245291 | 12/1985 |
| JP | 63-52461 | 3/1988 |
| JP | 10-284678 | 10/1998 |

OTHER PUBLICATIONS (Korean Office Action dated May 8, 2002, together with Japanese translation of same).

* cited by examiner

Primary Examiner—David L. Talbott
Assistant Examiner—John B. Vigushin
(74) Attorney, Agent, or Firm—McDermott, Will & Emery

(57) ABSTRACT

A lower semiconductor element is mounted facing down on an insulating circuit board, and an upper semiconductor element is stacked facing up on the lower semiconductor element. Openings are provided in the insulating circuit board at a location facing the element electrodes of the lower semiconductor element, and the element electrodes of the lower semiconductor element are connected to the board electrodes on the lower surface of the insulating circuit board through the openings. Also, the element electrodes of the upper semiconductor element are connected to the board electrodes on the upper surface of the insulating circuit board. Thus, a high-density semiconductor device is provided by stacking a plurality of semiconductor elements.

20 Claims, 8 Drawing Sheets

Fig. 6A
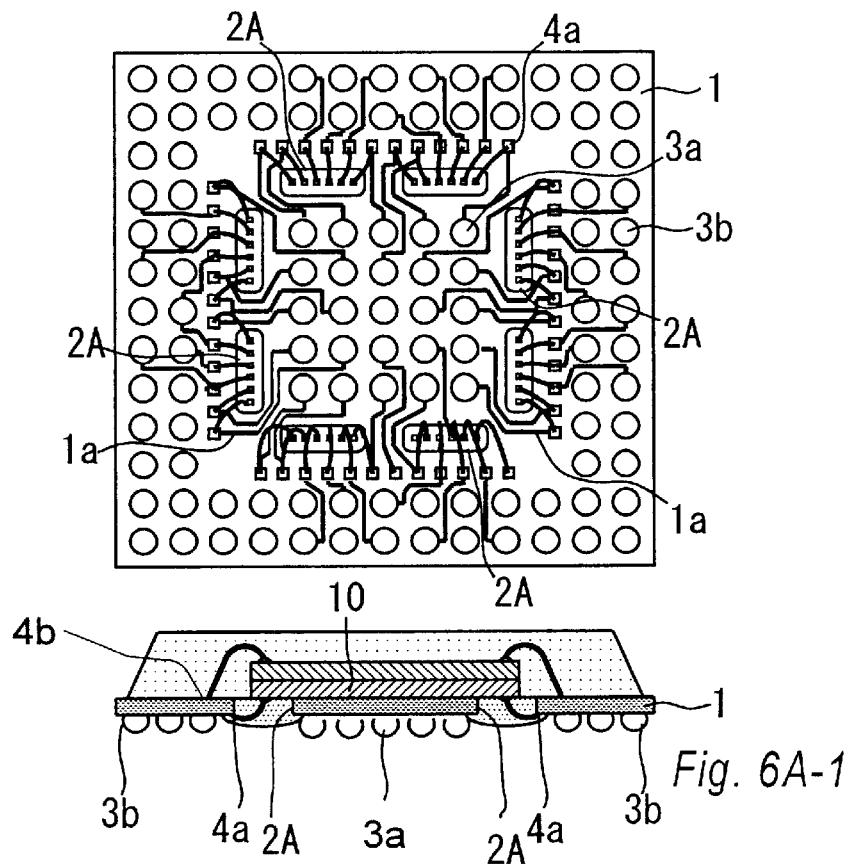
Fig. 6A-1
Fig. 6B
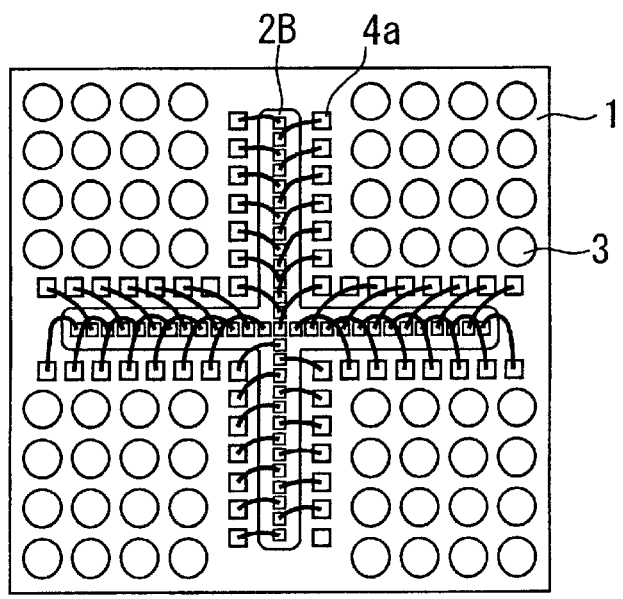

SEMICONDUCTOR DEVICE HAVING STACKED SEMICONDUCTOR ELEMENTS

BACKGROUND OF THE INVENTION

1. Field of the Invention

The present invention relates to mounting technique of semiconductor elements on a semiconductor insulating circuit board, more particularly to a high-density semiconductor device characterized by a structure having a plurality of stacked semiconductor elements for coping with downsizing, elevating performance, and diversifying functions.

2. Background Art

FIG. 8 is a sectional view showing a conventional semiconductor device having semiconductor elements of different sizes stacked on an insulating circuit board. In the conventional stacked semiconductor device, as FIG. 8 shows, semiconductor elements 10 and 20 are mounted facing up on a circuit board 1, and element electrodes 11 and 21 are connected to a board electrodes 4b on the top surface of the circuit board 1 with wires 12 and 22, respectively. External electrodes 3 are provided on the under side surface of the circuit board 1, and the upper side of the circuit board 1 is encapsulated by an encapsulating resin 6b.

Thus, the conventional semiconductor device having semiconductor elements 10 and 20 of different sizes stacked on an insulating circuit board 1 has the structure in which the upper semiconductor element 20 is smaller than the lower semiconductor element 10, and the element electrodes (chip electrodes) 11, 21 of such semiconductor elements 10, 20 are connected to board electrodes 4b using a wire bonding technique or the like. However, semiconductor elements of the same size cannot be stacked using such techniques. Also, for semiconductor elements having electrodes provided in the central portion of the elements, such techniques require long wires to connect these electrodes to the board electrodes, lowering the electrical properties.

SUMMARY OF THE INVENTION

The object of the present invention is to solve the above described problems in conventional semiconductor devices, and to provide a semiconductor device which enables higher density by stacking semiconductor elements of substantially the same size, and shorter loop length for internal connection.

According to one aspect of the present invention, a semiconductor device comprises a circuit board and a plurality of semiconductor elements. The circuit board has a top surface and a back surface on which board electrodes are arranged on said top and back surfaces, and in the circuit board predetermined openings are formed. Each of a plurality of semiconductor elements has a top surface and a back surface, and the element electrodes are arranged on said top surface. Further, a first semiconductor element is placed so that the top surface thereof faces to the top surface of said circuit board, and the element electrodes thereof are connected to the board electrodes on the back surface of said circuit board through said openings of said circuit board. A second semiconductor element is stacked so that the back surface thereof is joined to the back surface of said first semiconductor element, and the element electrodes thereof are connected to the board electrodes on the top surface of said circuit board.

According to another aspect of the present invention, a semiconductor device comprises a circuit board and a plurality of semiconductor elements. The circuit board has a top surface and a back surface, and the board electrodes are arranged on said top and back surfaces, and predetermined openings are formed in the circuit board. Each of a plurality of semiconductor elements has a top surface and a back surface, and element electrodes are arranged on said top surface. Further, a first semiconductor element is placed so that the top surface thereof faces to the top surface of said circuit board, and the element electrodes thereof are connected to the board electrodes on the back surface of said circuit board through said openings of said circuit board. A second semiconductor element having dimensions larger than the dimensions of said first semiconductor element is stacked such that the top surface thereof faces to the back surface of said first semiconductor element and the element electrodes thereof are out of the back surface of said first semiconductor element, and said element electrodes are connected to the board electrode on the back surface of said circuit board through said opening of said circuit board.

According to another aspect of the present invention, a semiconductor device comprises a circuit board and a semiconductor element. The circuit board has board electrodes placed on the top and back surfaces thereof and has a predetermined opening formed therein. The semiconductor element has element electrodes placed on the top surface thereof. The semiconductor element is placed so that the element electrodes thereof face to the top surface of said circuit board, and said element electrodes are connected to the board electrodes placed on the back surface of said circuit board through said opening formed in said circuit board. Further, said opening in said circuit board is formed to have a predetermined shape corresponding to the arrangement of element electrodes of said semiconductor element.

Other features and advantages of the invention will be apparent from the following description taken in connection with the accompanying drawings.

BRIEF DESCRIPTION OF THE DRAWINGS

FIGS. 1A and 1B show first examples, FIGS. 1C and 1D show second examples, FIGS. 2A and 2B show third examples, FIGS. 2C and 2D show fourth examples.

FIGS. 3A and 3B show first examples, FIGS. 3C and 3D show second examples, FIGS. 4A and 4B show third examples, and FIG. 4C shows a fourth example.

FIGS. 6A and 6B, and FIGS. 7A through 7D are diagrams each showing an insulating circuit board for stacking semiconductor elements, and a semiconductor device using the same according to a Fourth Embodiment of the present invention. Among the examples of an insulating circuit board of the Fourth Embodiment, FIG. 6A shows a first example, FIG. 6B shows a second example, FIG. 7A shows a third example, FIG. 7B shows a fourth example, FIG. 7C shows a fifth example, and FIG. 7D shows a sixth example.

DETAILED DESCRIPTION OF THE PREFERRED EMBODIMENTS

Figure 1A:
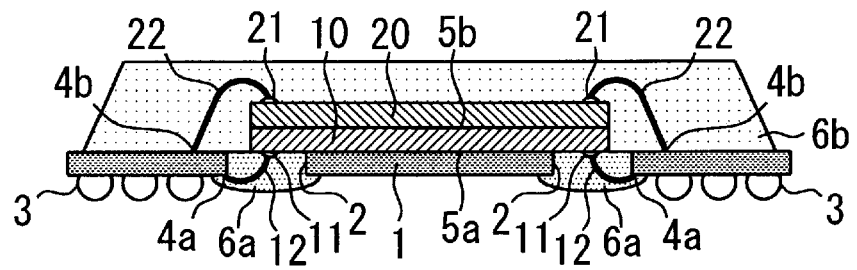
FIGS. 1A through 1D and FIGS. 2A through 2D are sectional views showing a semiconductor device according to a First Embodiment of the present invention, which comprise stacked semiconductor elements of substantially the same size mounted on an insulating circuit board. Among the examples of the semiconductor devices of the First Embodiment.

According to the present invention, a semiconductor element facing down is mounted on an insulating circuit board, and another semiconductor element facing up is stacked on the first semiconductor element. Openings are provided in the insulating circuit board at locations facing to the terminal electrodes of the lower semiconductor element, and the board electrode on the back surface of the insulating circuit board are connected with the element electrodes (terminal electrodes) of the semiconductor elements through such openings. Also, the element electrodes of the upper semiconductor element are connected with the board electrodes on the upper surface of the insulating circuit board, thereby enabling semiconductor elements of substantially the same size to be stacked, and the loop length for internal connection to be shortened.

Also according to the present invention, the freedom of wiring of the insulating circuit board can be increased, and the wiring area of pins or balls can be expanded for increasing the number of pins or balls, by changing the shape of openings in the insulating circuit board. In addition by integrally encapsulating internal connections and semiconductor elements, productivity can be improved.

The preferred embodiments of the present invention will be described below referring to appended drawings. In the drawings, the same or like elements are denoted by the same reference numerals, the description for such elements are simplified or omitted.

First Embodiment

FIGS. 1A through 1D and FIGS. 2A through 2D are sectional views showing a semiconductor device according to a First Embodiment of the present invention having stacked semiconductor elements of substantially the same size mounted on an insulating circuit board.

Figure 1B:
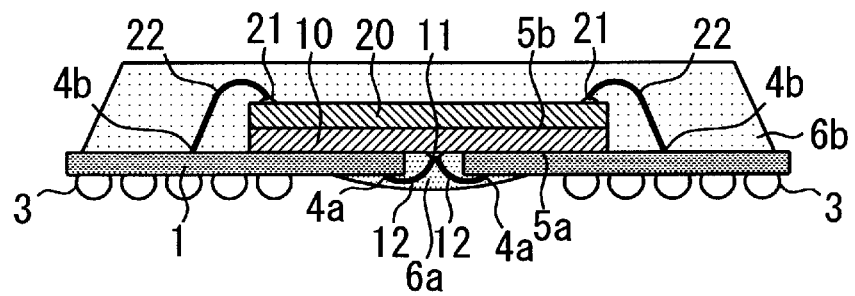

First, FIGS. 1A and 1B show first examples of semiconductor devices according to the First Embodiment.

FIG. 1A shows the structure in which the electrodes of a lower semiconductor element mounted facing down are present in the vicinity of the edges of the element; FIG. 1B shows the structure in which the electrodes of a lower semiconductor element mounted facing down are present in the vicinity of the central portion of the element.

In FIGS. 1A and 1B, reference numeral 1 denotes an insulating circuit board for mounting stacked semiconductor elements, 2 denotes openings provided in the insulating circuit board 1 for passing interconnecting wires, 3 denotes external electrodes of the insulating circuit board 1, 4a denotes board electrodes placed on the lower surface of the insulating circuit board 1 (under-the-board electrodes), and 4b denotes board electrodes placed on the upper surface of the insulating circuit board 1 (on-the-board electrodes). The under-the-board electrodes 4a and the on-the-board electrodes 4b are collectively called board electrodes 4 in the present descriptions.)

Reference numeral 10 denotes the lower semiconductor element mounted facing down on the board 1 (first semiconductor element), 11 denotes the element electrodes of the semiconductor element 10, and 12 denotes wires for electrically connecting the element electrodes 11 with the under-the-board electrodes 4a.

Reference numeral 20 denotes upper semiconductor element stacked facing up on the semiconductor element 10 (second semiconductor element), 21 denotes the element electrodes of the semiconductor element 20, and 22 denotes wires for electrically connecting the element electrodes 21 with the on-the-board electrodes 4b.

Reference numeral 5a denotes an adhesive for bonding the semiconductor element 10 with the board 1, 5b denotes an adhesive for bonding the semiconductor element 10 with the semiconductor element 20, 6a denotes an encapsulating resin for encapsulating the semiconductor element 10 and wires 12 from the under side of the board 1, and 6b denotes an encapsulating resin for encapsulating the semiconductor element 10, the semiconductor element 20, and wires 22 on the upper side of the board 1.

Thus, openings 2 are provided in the insulating circuit board 1. The semiconductor element 10 is mounted facing down, and the element electrodes 11 are electrically interconnected with the under-the-board electrodes 4a through the openings 2 of the insulating circuit board 1. The semiconductor element 20 is stacked facing up, and the element electrodes 21 are electrically interconnected with the on-the-board electrodes 4b.

In the structure of FIG. 1A, peripheral-electrode semiconductor elements, having element electrodes provided in the vicinity of the edge portions of the element, of substantially the same size, can be stacked.

On the other hand, in the structure of FIG. 1B, a peripheral-electrode semiconductor element can be stacked on a central-electrode semiconductor elements of substantially the same size, having element electrodes provided in the vicinity of the center portions of the element, and the area for placing external electrodes 3 can be expanded to the area of the board 1 underneath the semiconductor elements.

The structure of the semiconductor devices according to the first example of the First Embodiment may be summarized as follows.

As FIGS. 1A and 1B show, the semiconductor device according to the First Embodiment comprises a circuit board 1 having board electrodes 4a placed on the lower surface (back surface), board electrodes 4b placed on the upper surface (top surface), and predetermined openings 2; and a plurality of semiconductor elements 10, 20 each having a top surface and a back surface, and having element electrodes 11, 21 placed on the respective top surfaces.

The first semiconductor element 10 is placed with the top surface thereof facing to the top surface of the circuit board 1, and the element electrodes 11 are electrically connected to the board electrodes 4a on the back surface of the circuit board 1 through the openings 2 of the circuit board 1. The second semiconductor element 20 is stacked on the first semiconductor element 10 by bonding both back surfaces, and the element electrodes 21 are electrically connected to the board electrodes 4b on the top surface of the circuit board 1.

Also as FIG. 1A shows, the element electrodes 11 of the first semiconductor element 10 are placed on the vicinity of the edge portions of the element, and the openings 2 of the circuit board 1 are formed at locations corresponding to the element electrodes 11.

Also as FIG. 1B shows, the element electrodes 11 of the first semiconductor element 10 are placed on the vicinity of the center portions of the element, and the opening 2 of the circuit board 1 is formed at the location corresponding to the element electrodes 11.

The first semiconductor element 10 has typically almost the same shape and size as the second semiconductor element 20, and is almost entirely stacked on the second semiconductor element 20. However, the shape and size may be different.

Figure 1C:
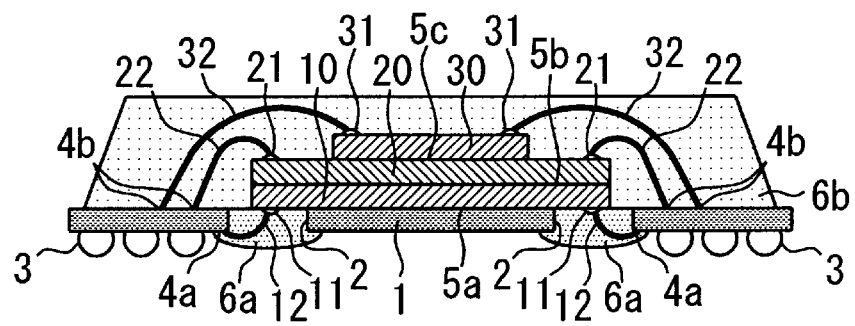
Figure 1D:
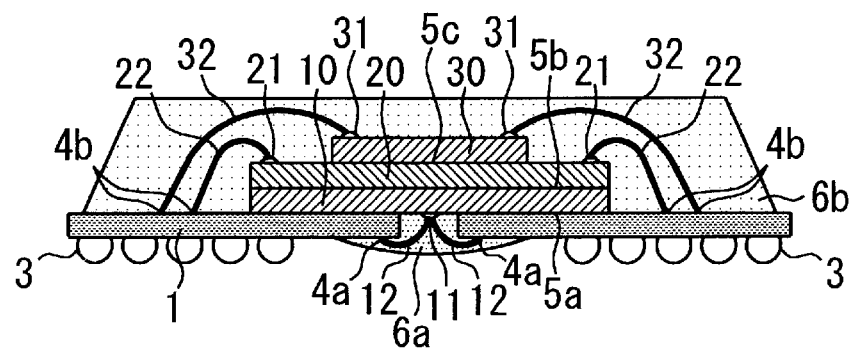

Next, FIGS. 1C and 1D show second examples of semiconductor devices according to the First Embodiment.

In FIGS. 1C and 1D, reference numeral 30 denotes the uppermost semiconductor element (third semiconductor element) stacked facing up on the semiconductor element 20, 31 denotes the element electrodes of the semiconductor element 30, and 32 denotes wires for electrically connecting the element electrodes 31 to the on-the-board electrodes 4b.

Reference numeral 5c denotes an adhesive bonding semiconductor elements 20 and 30 with each other, and 6b denotes an encapsulating resin for encapsulating semiconductor elements 10, 20, and 30, and wires 22 and 32 on the upper surface of the board 1.

In semiconductor devices shown in FIGS. 1C and 1D, at least one semiconductor element 30, of the size smaller than semiconductor elements 10 and 20 in the structures shown in FIGS. 1(a) and (b), is further stacked facing up on the semiconductor elements 20, and the element electrodes 31 of the semiconductor element 30 are electrically connected to the on-the-board electrodes 4b.

In semiconductor devices of FIGS. 1C and 1D, three or more semiconductor elements 10, 20, and 30 including those of the same size can be stacked, enabling the semiconductor device to have higher density.

The structures of semiconductor devices according to the second examples of the First Embodiment may be summarized as follows.

In the semiconductor devices according to the First Embodiment, as FIGS. 1C and 1D shows, a third semiconductor element 30 smaller than the second semiconductor element 20 is stacked on the second semiconductor element 20, which has been stacked on the first semiconductor element 10, as shown in FIGS. 1A and 1B by bonding the back surface of the third semiconductor element 30 with the top surface of the second semiconductor element 20 (i.e. in the facing-up structure), and the element electrodes 31 of the third semiconductor element 30 are connected to the board electrodes 4b on the top surface of the circuit board 1.

Figure 2A:
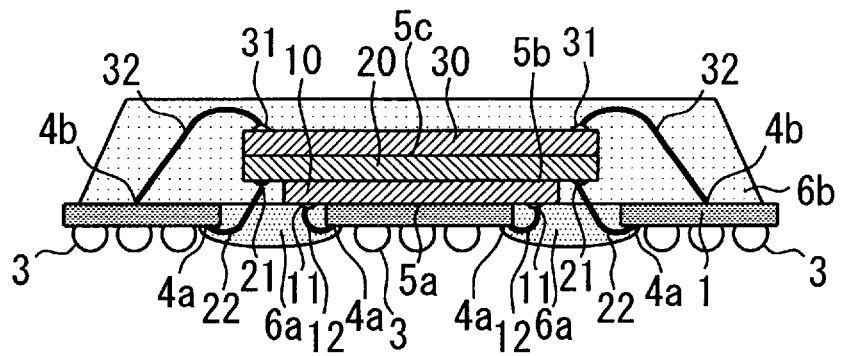
Figure 2B:
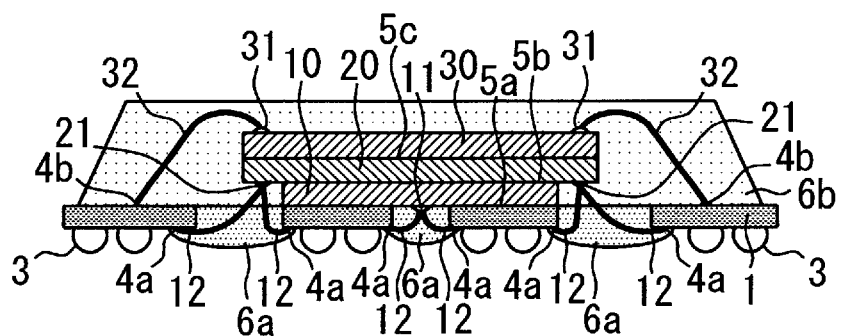

Next, FIGS. 2A and 2B show third examples of semiconductor devices according to the First Embodiment.

In FIGS. 2A and 2B, reference numeral 1 denotes a circuit board, 2 denotes openings, 3 denotes external electrodes, 4a denotes under-the-board electrodes, and 4b denotes on-the-board electrodes.

Reference numeral 10 denotes a lower semiconductor element (first semiconductor element) mounted facing down on the board 1, 11 denotes the element electrodes thereof, and 12 denotes wires for electrically connecting the element electrodes 11 to the under-the-board electrodes 4a.

Reference numeral 20 denotes an upper semiconductor element (second semiconductor element) stacked facing down on the semiconductor element 10, 21 denotes the element electrodes thereof, and 22 denotes wires for electrically connecting the element electrodes 21 to the under-the-board electrodes 4a.

In these cases, the lower semiconductor element 10 is smaller than the upper semiconductor element 20 so as not to touch with element electrodes 21 on the edge portions of the upper semiconductor element 20.

Reference numeral 30 denotes an uppermost semiconductor element (third semiconductor element) stacked facing up on the upper semiconductor element 20, 31 denotes the element electrodes thereof, and 32 denotes wires for electrically connecting the element electrodes 31 to the on-the-board electrodes 4b.

Reference numerals 5a, 5b, and 5c denote adhesives, and 6a and 6b denote encapsulating resins.

The semiconductor devices shown in FIGS. 2A and 2B has structures in which, in the semiconductor device comprising a lower semiconductor element 10 having element electrode placed on the edge portions thereof as shown in FIG. 1A or 1C, a smaller semiconductor element 10 is further included, as shown in FIG. 2A or 2B, facing down between the insulating circuit board 1 and the lower semiconductor element 10 of FIG. 1A or 1B.

The electrodes of the lowermost semiconductor element 10 are present on the edge portions of the element in the structure shown in FIG. 2A, and on the central portion of the element in the structure shown in FIG. 2B.

The structures shown in FIGS. 2A and 2B allow a smaller semiconductor element to underlie relaxing the restriction of mounting locations due to size, and enables the mounting area of external electrodes 3 to be expanded.

Although structures having three stacked semiconductor elements 10, 20, and 30 is described referring to FIGS. 2A and 2B, the structure may have only two stacked semiconductor elements 10 and 20.

The structures of semiconductor devices according to the third examples of the First Embodiment may be summarized as follows:

The semiconductor device of this embodiment as shown in FIGS. 2A and 2B, comprises a circuit board 1 having board electrodes 4b on the upper surface (top surface) and board electrodes 4a on the lower surface (back surface), and predetermined openings 2; and at least a plurality of semiconductor elements 10, 20 each having a top surface and a back surface, and having element electrodes 11, 21 on respective top surfaces.

The first semiconductor element 10 is placed with the top surface thereof facing to the top surface of the circuit board 1 (i.e. facing down), and the element electrodes 11 are connected to the board electrodes 4a on the back surface of the circuit board 1 through the openings 2 of the circuit board 1. The second semiconductor element 20 larger than the first semiconductor element 10 is stacked on the first semiconductor element 10 with the top surface thereof facing to the back surface of the first semiconductor element 10, such that the element electrodes 21 are out of the back surface of the first semiconductor element 10, and the element electrodes 21 are electrically connected to the board electrodes 4a on the back surface of the circuit board 1 through the openings 2 of the circuit board 1.

Also as FIG. 2A shows, the element electrodes 11 of the first semiconductor element 10 are placed on the vicinity of the edge portions of the element, and at least a portion of the openings 2 of the circuit board 1 are formed at locations facing to the element electrodes 11.

Also as FIG. 2B shows, the element electrodes 11 of the first semiconductor element 10 are placed on the vicinity of the center portions of the element, and at least a portion of the openings 2 of the circuit board 1 are formed at locations facing to the element electrodes 11.

Furthermore, as FIGS. 2A and 2B show, the third semiconductor element 30 is stacked on the second semiconductor element 20 by joining the back surface of the third semiconductor element 30 with the back surface of the second semiconductor element 20, and the element electrode 31 of the third semiconductor element 30 are connected to the board electrodes 4b on the circuit board 1.

The structures of semiconductor devices according to the third examples of the First Embodiment may, alternatively, be summarized as follows.

In the semiconductor device according to this embodiment, as FIGS. 2A and 2B show, the smaller semiconductor element 10 are placed facing down underneath the two semiconductor elements shown in FIG. 1A, and between the circuit board 1 and the lower semiconductor element; and the element electrodes 11 of the semiconductor element 10 are electrically connected to the under-the-board electrodes 4a of the circuit board 1.

Also as FIG. 2A shows, the element electrodes 11 of the lowermost semiconductor element 10 are placed on the vicinity of the edge portions of the element, and the openings 2 are provided in the facing insulating circuit board 1 so that the element electrodes 11 and the insulating circuit board 1 can be interconnected through the openings 2.

Also as FIG. 2B shows, the element electrodes 11 of the lowermost semiconductor element 10 are placed on the vicinity of the center portions of the element, and the openings 2 are provided in the facing insulating circuit board 1 such that the element electrodes 11 and the insulating circuit board 1 are interconnected through the openings 2.

Figure 2C:
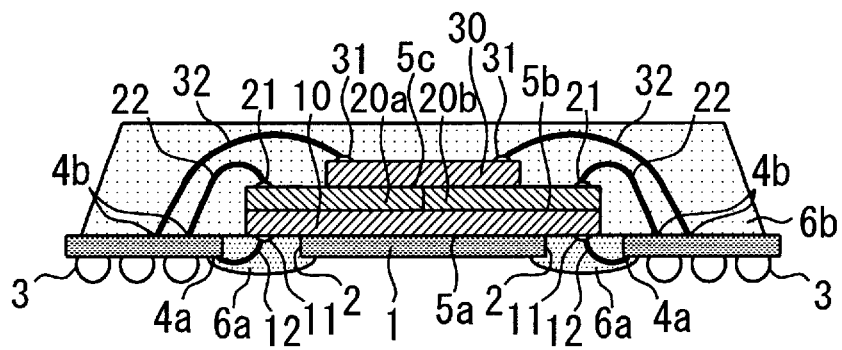
Figure 2D:
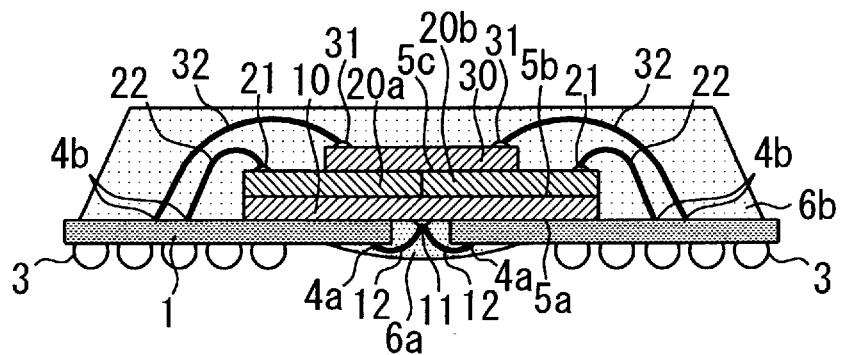

Next, FIGS. 2C and 2D show fourth examples of semiconductor devices according to the First Embodiment.

In FIGS. 2C and 2D, 20a and 20b denote semiconductor elements stacked in the same level.

The semiconductor devices as shown in FIGS. 2C and 2D comprises semiconductor elements in more than two levels on the insulating circuit board 1, and at least one smaller semiconductor element 30 is stacked facing up on the uppermost level, in the same way as shown in FIGS. 1C and 1D. Further, at least two semiconductor elements 20a, 20b are placed in the same level.

The semiconductor devices as shown in FIGS. 2C and 2D are semiconductor devices each comprising at least one smaller semiconductor element 30 stacked facing up on the uppermost level, as shown in FIGS. 1C and 1D, but comprising at least two semiconductor elements 20a, 20b placed in the same level, and at least two levels of semiconductor elements mounted on the insulating circuit board 1.

In the structure of FIGS. 2C and 2D, since more than two semiconductor elements are placed in a same level in the horizontal direction, the overall height can be lowered, and the area can be utilized effectively.

The structures of semiconductor devices according to the fourth examples of the First Embodiment may be summarized as follows.

In the semiconductor device of this embodiment, as FIGS. 2C and 2D shows, one of the first through third semiconductor elements 10, 20, or 30, shown in FIGS. 1A through 1D, and FIGS. 2A and 2B, is divided into two or more semiconductor elements in the same level.

In other words, in the structure, semiconductor elements are mounted on a circuit board 1 in more than two levels, and in one of the levels at least two semiconductor elements are placed adjoining horizontally.

Second Embodiment

FIGS. 3A through 3D and FIGS. 4A through 4C are sectional views each showing a semiconductor device according to a Second Embodiment of the present invention, in which a plurality of semiconductor elements of almost the same size are stacked on an insulating circuit board. This second embodiment particularly relates to a method of connecting electrodes of semiconductor elements with electrodes of an insulating circuit board.

Figure 3A:
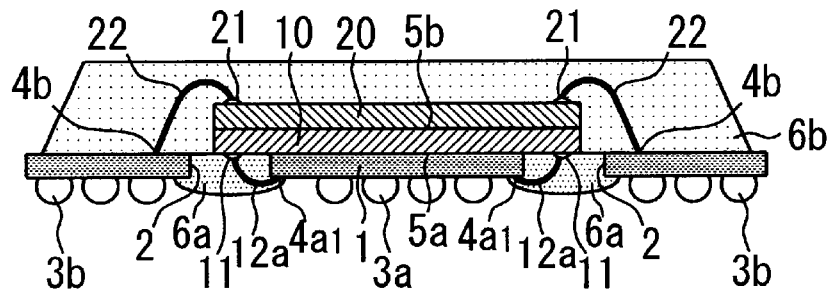
FIGS. 3A through 3D and FIGS. 4A through 4C are sectional views each showing a semiconductor device according to a Second Embodiment of the present invention, in which a plurality of semiconductor elements of almost the same size are stacked on an insulating circuit board. This second embodiment particularly relates to a method of connecting electrodes of semiconductor elements with electrodes of an insulating circuit board. Among the examples of the semiconductor devices of the Second Embodiment.
Figure 3B:
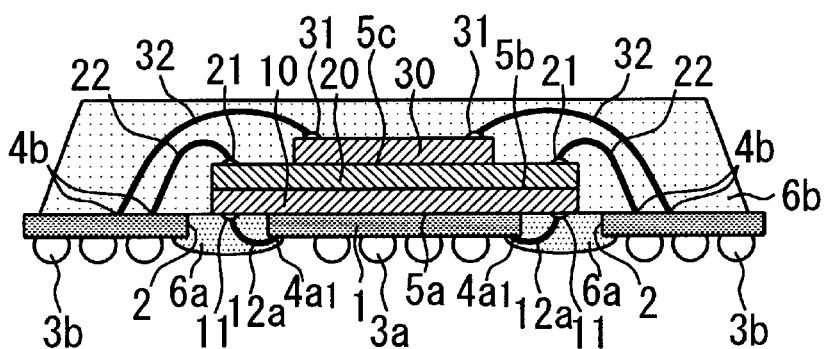

First, FIGS. 3A and 3B show first examples of semiconductor devices of the Second Embodiment.

Each of FIGS. 3A and 3B shows a structure in which the electrodes of a lower semiconductor element mounted facing down are present in the vicinity of the edges of the semiconductor element.

In FIGS. 3A and 3B, reference numeral 1 denotes an insulating circuit board, 2 denotes openings provided in the circuit board 1, 3a denotes external electrodes of the circuit board 1 placed on the lower surface thereof in the area surrounded by the openings 2 (inside external electrodes), 3b denotes external electrodes of the circuit board 1 placed on the lower surface thereof in the area outside the openings 2 (outside external electrodes), 4a1 denotes under-the-board electrodes placed on the lower surface of the circuit board 1 in the area surrounded by the openings 2 (under-the-board inside electrodes). As required, reference numerals 3a and 3b are collectively denoted by symbol 3.

Reference numeral 10 denotes a lower semiconductor element mounted facing down on the circuit board 1 (first semiconductor element), 11 denotes the element electrodes of the semiconductor element 10, and 12a denotes wires for electrically connecting the element electrodes 11 with the under-the-board inside electrodes 4a1.

Figure 7A:
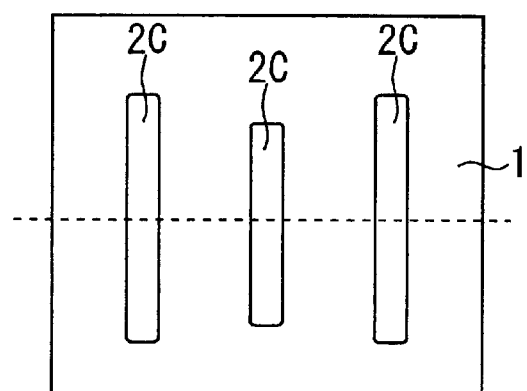
Figures 1, 7A:
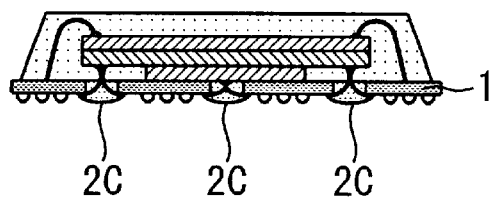

Since other reference numerals have the same meanings as in FIG. 1, further description will be omitted.

In this Second embodiment, as FIGS. 3A and 3B show, under-the-board electrodes 4a1 are provided on the lower surface of the circuit board 1 in the area beneath the lowermost semiconductor element 10. Accordingly, external electrodes 3a corresponding to the lowermost semiconductor element 10 can be provided on the lower surface of the circuit board 1 beneath the semiconductor element 10. This is different from the structures of FIGS. 1A and 1C, in which the element electrodes 11 of the lowermost semiconductor element 10 are placed on the edge portions of the element, and these element electrodes 11 are electrically connected to external electrodes 4a of the lower surface of the circuit board 1 outside of the openings 2, and in which external electrodes 3 of the circuit board 1 cannot be provided on the area underneath the semiconductor element 10.

The structure as shown in FIGS. 3A and 3B increases the freedom of designing external electrodes 3, and can accommodate increase in pins and balls.

The structures of the semiconductor devices according to the first example of the Second Embodiment may be summarized as follows.

In the semiconductor of this embodiment, as FIGS. 3A and 3B show, a part of board electrodes 4a are placed on the back surface of the circuit board 1 inside the area beneath the first semiconductor element 10, and the element electrodes 11 of the first semiconductor element 10 are connected to the board electrodes 4a1 on the back surface of the circuit board 1 inside the above described area through the openings 2 of the circuit board 1.

In other words, the board electrodes 4a on the lower surface of the circuit board 1 are provided on the back surface of the circuit board 1 inside the area of the lowermost semiconductor element 10 for using as board electrodes 4a corresponding to the lowermost semiconductor element 10.

Figure 3C:
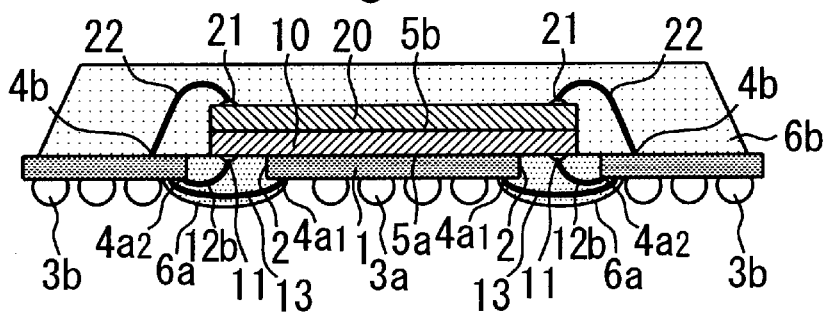
Figure 3D:
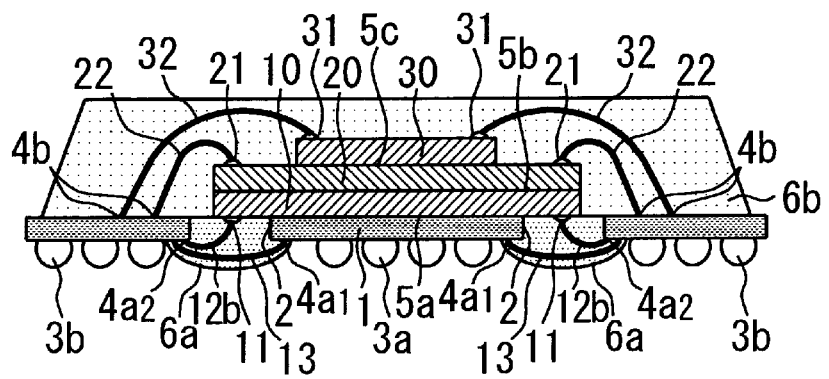

Next, FIGS. 3C and 3D show second examples of semiconductor devices according to the Second Embodiment.

In FIGS. 3C and 3D, reference numeral 4a2 denotes under-the-board electrodes placed on the lower surface of the circuit board 1 in the outer side of the openings 2 (under-the-board outside electrodes), 11 denotes the element electrodes of the semiconductor element 10, 12b denotes wires for electrically connecting the element electrodes 11 to the under-the-board outside electrodes 4a2, and 13 denotes jumper lines for connecting the under-the-board outside electrodes 4a2 to the under-the-board inside electrodes 4a1. As required, reference numerals 4a1 and 4a2 are collectively denoted by symbol 4a. Since other symbols are the same as those in FIG. 1A through FIG. 3B, further description will be omitted.

Each of semiconductor devices shown in FIGS. 3C and 3D has the structure in which under-the-board electrodes 4a are provided inside and outside the area beneath the lowermost semiconductor element 10, the element electrodes 11 of the lowermost semiconductor element 10 are connected to under-the-board outside electrodes 4a2, and these under-the-board outside electrodes 4a2 are connected to under-the-board inside electrodes 4a1 with jumpers, and the same effect as in above described structures of FIGS. 3A and 3B can be obtained.

The structures of the semiconductor devices according to the second example of the Second Embodiment may be summarized as follows.

In the semiconductor devices according to this embodiment, as FIGS. 3C and 3D show, board electrodes 4a are placed inside and outside the area of the first semiconductor element 10 on the back surface of the circuit board 1. The element electrodes 11 of the first semiconductor element 10 are connected to board electrodes 4a2 outside the above described area on the back surface of the circuit board 1 through the openings 2 of the circuit board 1, and the board electrodes 4a2 outside the above described area is connected to board electrodes 4a1 inside the above described area with wires.

In other words, board electrodes 4a on the lower surface of the circuit board 1 are provided inside and outside the area of the lowermost semiconductor element 10, the element electrodes 11 of the lowermost semiconductor element 10 are connected to outside-the-board electrodes 4a2 on the lower surface of the circuit board 1, and the outside-the-board electrodes 4a2 are connected to the inside-the-board electrodes 4a1 with jumpers.

Figure 4A:
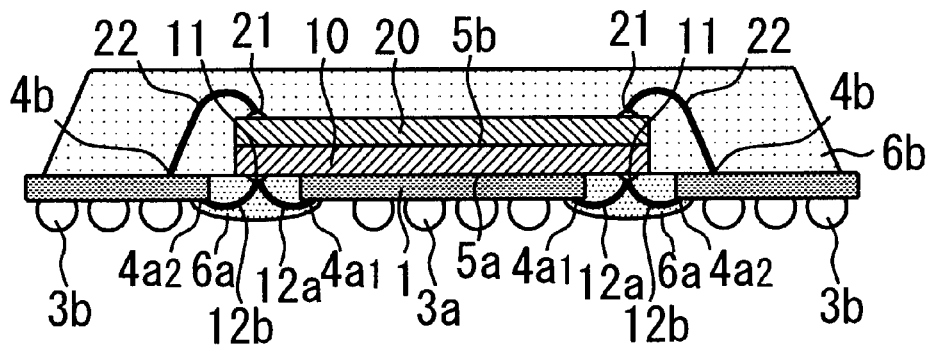
Figure 4B:
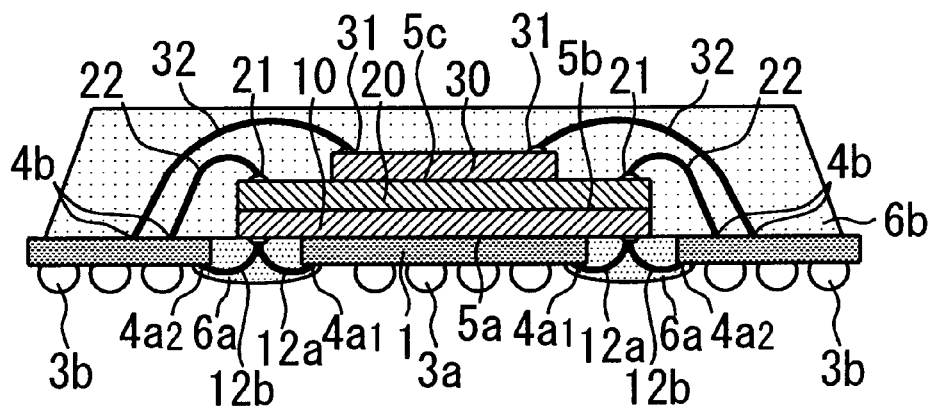

Next, FIGS. 4A and 4B show third examples of semiconductor devices according to the Second Embodiment.

In FIGS. 4A and 4B, reference numeral 11 denotes element electrodes of the semiconductor element 10, 12a denotes wires for electrically connecting element electrodes 11 to under-the-board inside electrodes 4a1, and 12b denotes wires electrically connecting element electrodes 11 to under-the board outside electrodes 4a2. As required, reference numerals 12a and 12b are collectively shown by reference numeral 12. Since other symbols are the same as those in FIG. 1A through FIG. 3B, further description will be omitted.

Each of semiconductor devices shown in FIGS. 4A and 4B has the structure in which under-the-board electrodes 4a are provided inside and outside the area beneath the lowermost semiconductor element 10, the element electrodes 11 of the lowermost semiconductor element 10 are connected to under-the-board inside electrodes 4a1, and element electrodes 11 of the lowermost semiconductor element 10 are connected to under-the-board outside electrodes 4a2, and the same effect as in above described structures of FIGS. 3A and 3B can be obtained.

The structures of the semiconductor devices according to the third examples of the Second Embodiment may be summarized as follows.

In the semiconductor devices according to this embodiment, as FIGS. 4A and 4B show, board electrodes 4a are placed inside and outside the area beneath the first semiconductor element 10 on the back surface of the circuit board 1, and the element electrodes 11 of the first semiconductor element 10 are connected to board electrodes 4a1 and/or 4a2 inside and outside of the above described area on the back surface of the circuit board 1 through the openings 2 of the circuit board 1.

In other words, board electrodes 4a on the lower surface of the circuit board 1 are provided inside and outside of the area beneath the lowermost semiconductor element 10, and the electrodes 11 of the lowermost semiconductor element 10 are connected to under-the-board outside electrodes 4a2 and/or under-the-board inside electrodes 4a1.

Figure 4C:
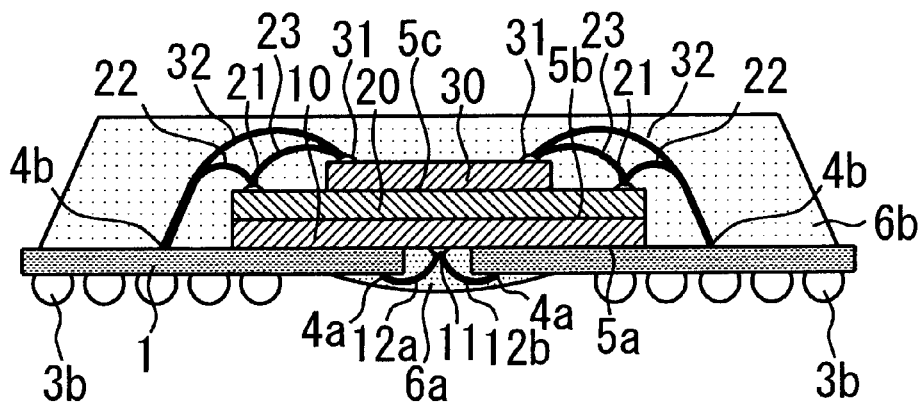

Next, FIG. 4C shows a fourth example of semiconductor devices according to the Second Embodiment.

In FIG. 4C, reference numeral 23 denotes inter-element wires directly connecting element electrodes 21 of the semiconductor element 20 to element electrodes 31 of the semiconductor element 30.

The semiconductor device shown in FIG. 4C has the structure having at least two stacked semiconductor elements, in which electrodes 21 and 31 of the semiconductor elements 20 and 30 are directly electrically connected to each other, in addition to the connection between element electrodes 11, 21, and 31 with board electrodes 4a and 4b.

Such a connection method enables a shortened loop, and enables the reduction of the area required for the board electrodes 4 of the insulating circuit board 1.

The structures of the semiconductor device according to the fourth example of the Second Embodiment may be summarized as follows.

In the semiconductor devices according to this embodiment, as FIG. 4C shows, any of element electrodes 11, 21, and 31 of first to third element devices 10, 20, and 30, respectively, are directly electrically interconnected.

In other words, in a structure having at least two stacked semiconductor elements, electrodes of the semiconductor elements are directly electrically interconnected.

Third Embodiment

Figure 5A:
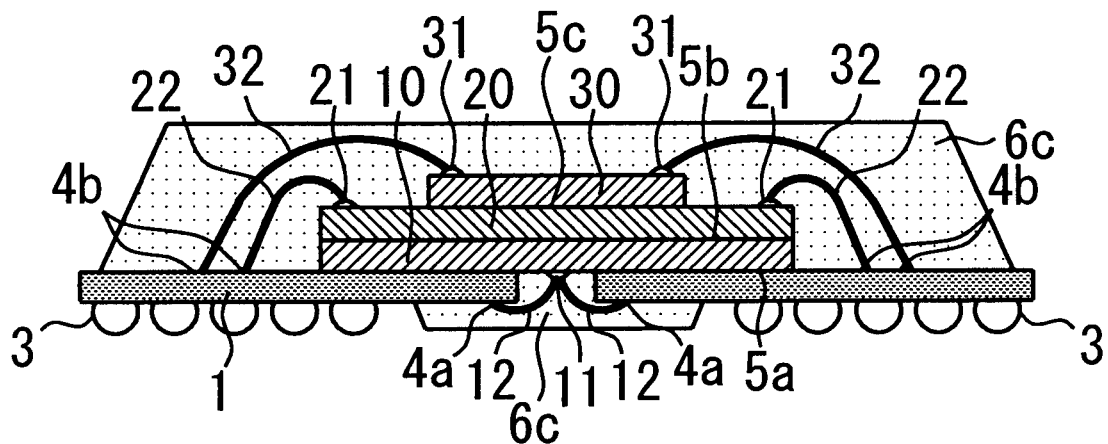
FIGS. 5A and 5B are sectional views each showing a semiconductor device having semiconductor elements of substantially the same size stacked on an insulating circuit board in a Third Embodiment of the present invention.
Figure 5B:
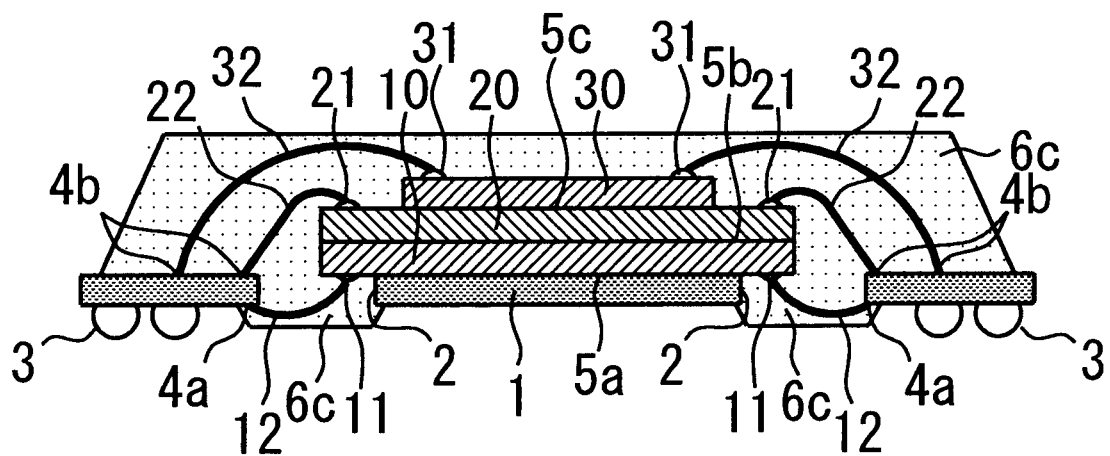

FIGS. 5A and 5B are sectional views each showing a semiconductor device having semiconductor elements of substantially the same size stacked on an insulating circuit board in a Third Embodiment of the present invention. In particular, the Third Embodiment relates to a method for encapsulating a semiconductor device.

Third Embodiment will be described below referring to FIGS. 5A and 5B.

In FIGS. 5A and 5B, 6c denotes an encapsulating resin which encapsulates semiconductor elements 10, 20, and 30, and accompanying wires and which are formed simultaneously from the upper and lower sides of the circuit board 1. The stacked state of the semiconductor elements 10, 20, and 30 is the same as examples shown in FIGS. 1C and 1D. However, in FIGS. 1C and 1D, material of the encapsulating resin 6a and 6b on the lower or upper side of the circuit board 1 may be different, and the encapsulating resin 6a and 6b may not be formed concurrently. This feature of the examples of FIGS. 5A and 5B is different in this point.

In the semiconductor devices according to this embodiment, as exemplified in FIGS. 5A and 5B, an encapsulating resin collectively encapsulate the semiconductor elements 10, 20, 30, the openings 2 and the accompanying connecting portions to the circuit board 1 in the structure shown in FIGS. 1 through 4 of the Embodiments 1 and 2.

By collective resin encapsulation, as FIGS. 5A and 5B shows, the productivity of semiconductor devices can be improved.

Fourth Embodiment

FIGS. 6A and 6B, and FIGS. 7A through 7D are diagrams each showing an insulating circuit board for stacking semiconductor elements, and a semiconductor device using the same according to a Fourth Embodiment of the present invention.

First, FIG. 6A shows a first example of an insulating circuit board according to the Fourth Embodiment.

In FIG. 6A, reference numeral 1 denotes an insulating circuit board for mounting stacked semiconductor elements, 1a denotes wires provided on the lower surface of the board, 2A denotes openings formed in the circuit board 1 for passing connecting wires, 3a denotes external electrodes placed on the lower surface of the circuit board 1 in the area surrounded by the openings 2A (inside external electrodes), 3b denotes external electrodes placed on the lower surface of the circuit board 1 in the outer side area of the openings 2A (outside external electrodes), and 4a denotes circuit board electrodes placed on the lower surface of the circuit board 1 and facing the openings 2A (under-the-board electrodes). As required, reference numerals 3a and 3b are collectively named as 3.

The circuit board 1 of FIG. 6A has a structure having at least one opening 2A along each side of the circuit board 1. On the lower surface of the circuit board 1, board wires 1a are passed through the space between openings 2A. These board wires 1a connect under-the-board electrodes 4a to inside external electrodes 3a.

This structure increases the freedom of positioning wires and external electrodes 3, and enables the area for placing external electrodes 3 to expand to the area of the circuit board 1 underneath the semiconductor element.

By using such a circuit board 1, a semiconductor device as shown in the sectional view of the lower part of FIG. 6A is obtained.

The structure of the semiconductor device according to the first example of the Fourth Embodiment may be summarized as follows.

As FIG. 6A shows, the semiconductor device of this embodiment comprises a circuit board 1 which has board electrodes 4b placed on the upper surface (top surface) and board electrodes 4a placed on the lower surface (back surface) and in which the predetermined openings 2A are formed, and at least one semiconductor element 10 having element electrodes 11 placed on the top surface.

In this semiconductor device, the semiconductor element 10 is placed on the circuit board 1 with the element electrodes 11 facing the opening 2A in the circuit board 1, and the element electrodes 11 are connected to board electrodes 4a on the back surface of the circuit board 1 through the openings 2A of the circuit board 1. The openings 2A of the circuit board 1 are formed to have predetermined shapes corresponding to the placement of the element electrodes 11 of the semiconductor element 10.

As FIG. 6A shows, a plurality of openings 2A are formed in the circuit board 1, corresponding to the placement of the element electrodes 11 of the semiconductor element 10. On the back surface of the circuit board 1, wires 1a are provided between the plurality of openings 2A. The plurality of openings 2A of the circuit board 1 are placed so as to form a rectangular shape having one or more openings 2A in one side. In other words, one or more openings 2A are provided along one side of a rectangular or square shape on the positions corresponding to the electrodes provided in the edge portions of the semiconductor element 10 mounted facing down, and wires 1a are provided between these openings 2A.

Next, FIG. 6B shows a second example of an insulating circuit board according to the Fourth Embodiment.

In FIG. 6B, 2B denotes an opening provided in the circuit board 1 for passing connecting wires, 3 denotes external electrodes placed on the lower surface of the circuit board 1, and 4a denotes board electrodes placed on the lower surface of the insulating circuit board 1 facing the opening 2B. In the circuit board 1 of FIG. 6B, an opening 2B of the insulating circuit board 1 has a cross-shape structure.

Since this structure facilitates to pass wires, and the continuous opening 2B is encapsulated by a resin, the productivity of the semiconductor device can be improved.

Using such a circuit board 1, semiconductor devices as shown in FIGS. 1B and 1D, FIG. 2D, and FIG. 4C can be obtained.

Next, FIG. 7A shows a third example of an insulating circuit board according to the Fourth Embodiment.

In FIG. 7A, the upper diagram is a plan showing a circuit board, and the lower diagram is a sectional view showing an example of semiconductor devices using this circuit board. This lower diagram corresponds to FIG. 2B.

In FIG. 7A, 2C denoted openings provided in the circuit board 1 for passing connecting wires. The circuit board 1 of FIG. 7A has a structure having three or more openings 2C of the circuit board 1 present in the same direction.

This is an effective structure depending to the placement of the electrodes or the position of the semiconductor element stacked on the upper level of the circuit board 1. For example, in the structure in which a first semiconductor element having electrodes in the central portion of the element is mounted facing down on the circuit board 1, and a second semiconductor element having electrodes in the edge portion of the element is mounted facing down on the first semiconductor element, since the board openings 2C are present at the positions facing to element electrodes of each semiconductor element, the freedom of wires and external electrodes 3 is increased. This also enables inner connection loops to be shortened.

By using such an insulating circuit board 1, the semiconductor device as shown in FIG. 2B is obtained.

Figure 7B:
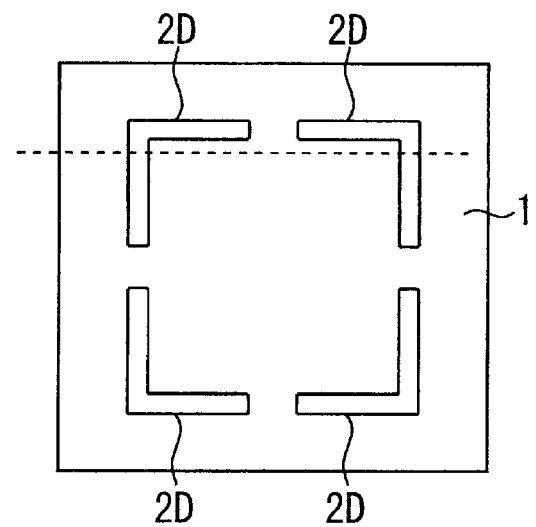
Figures 1, 7B:
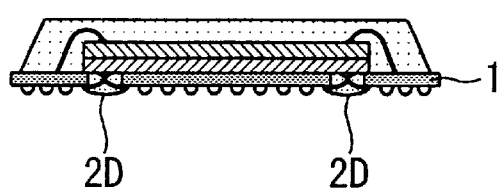

Next, FIG. 7B shows a fourth example of an insulating circuit board according to the Fourth Embodiment.

In FIG. 7B, the upper diagram is a plan showing a circuit board, and the lower diagram is a sectional view showing an example of semiconductor devices using this circuit board. This lower diagram corresponds to FIG. 4A. In FIG. 7B, 2D denotes L-shaped openings provided in the circuit board 1 for passing connecting wires. The circuit board 1 of FIG. 7B has a structure having openings 2D at the corner portions of the circuit board 1.

In this structure, for example, the same effect as described above can be obtained in a semiconductor device in which a semiconductor element having electrodes on the four corner portions of the element is stacked facing down, or a semiconductor element having electrodes on the two edge portions of the element is stacked facing down.

By using such an insulating circuit board 1, the semiconductor device as shown in FIG. 1C, FIGS. 2A and 2C, FIGS. 3A through 3D, FIGS. 4A and 4B, and FIG. 5B.

Figure 7C:
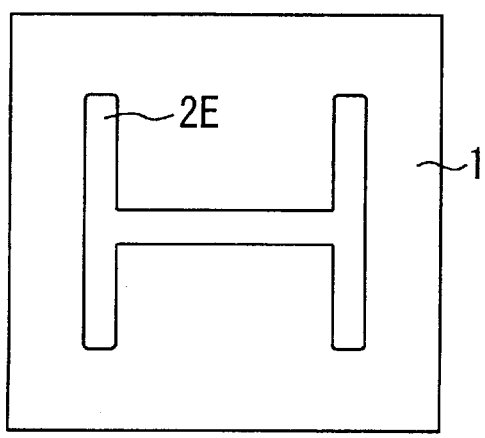

Next, FIG. 7C shows a fifth example of an insulating circuit board according to the Fourth Embodiment.

In FIG. 7C, 2E denotes an opening provided in the circuit board 1 for passing connecting wires. The circuit board 1 of FIG. 7C has a structure having an H-shaped opening 2E.

In this structure, for example, the same effect as described above can be obtained in a structure in which a semiconductor element having electrodes on the central portion of the element is mounted facing down, and a semiconductor element having electrodes on the edge portions of the element is stacked facing down. Also, since the opening 2 is continuous, an encapsulation by a resin is performed. Accordingly, the productivity of the device can be improved.

Figure 7D:
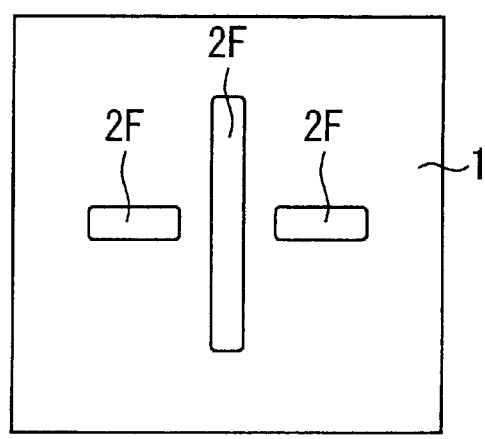
Figure 8:
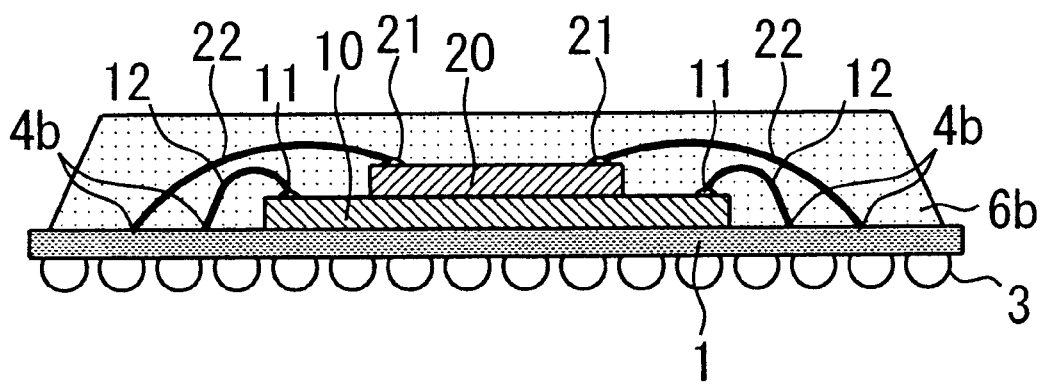
FIG. 8 is a sectional view showing a conventional semiconductor device having semiconductor elements of different sizes stacked on an insulating circuit board.

Next, FIG. 7D shows a sixth example of an insulating circuit board according to the Fourth Embodiment.

In FIG. 7D, 2F denotes an opening provided in the circuit board 1 for passing connecting wires. The circuit board 1 of FIG. 7D has a structure having an opening 2F at an almost central portion of the circuit board 1, and discontinuous openings 2F in the direction perpendicular to the direction of the above described opening 2F.

When compared with the circuit board of FIG. 6B, wires can be passed between openings 2F, so that the freedom of the locations of wires and external electrodes 3 is increased, and the area for placing external electrodes 3 can be expanded.

As described above, in the semiconductor device of this embodiment, as FIG. 7D shows, a plurality of openings 2F of the circuit board 1 are formed such that openings 2F are formed on both sides of a linear opening 2F in the direction almost perpendicular to the linear opening 2F.

As shown above in a various examples, this embodiment provides circuit boards for packaging as applied to semiconductor devices of FIGS. 6A and 6B, and FIGS. 7A through 7D.

Since the structures of these boards have already been described, brief summaries will be described below:

In a circuit board 1 according to this embodiment, as shown in FIG. 6B, an opening 2F is formed, and the top surface of the semiconductor element is mounted facing down, and the opening 2B of a predetermined single, continuous shape is formed corresponding to the placement of element electrodes of the semiconductor element.

In another circuit board 1 according to this embodiment, as shown in FIG. 6A, a plurality of openings 2A are formed at predetermined locations corresponding to the placement of element electrodes of the semiconductor element.

According to the present invention, as described above in detail, semiconductor devices of almost the same size can be stacked, and the length of the loop for inner connection can be shortened, by mounting a semiconductor element facing down on an insulating circuit board; by mounting another semiconductor element facing up on the upper surface of the above described semiconductor element, providing one or more openings in the insulating circuit board at the location facing the element electrodes (terminal electrodes) of the lower semiconductor element, and connecting board electrodes on the lower surface of the insulating circuit board with the element electrodes (terminal electrodes) of the semiconductor element; and by connecting the element electrodes of the upper semiconductor element with board electrodes on the upper surface of the insulating circuit board.

Also, by changing the shapes of openings of the insulating circuit board, the freedom of the location of wires on the insulating circuit board, and the wiring area for pins or balls can be expanded, thus accommodating increase in the number of pins and balls. Also by encapsulating inner connections and semiconductor elements collectively, the productivity of semiconductor devices can be improved.

Although the cases where two or three levels of semiconductor elements are stacked are described in the above embodiments, the present invention is not limited by these cases. For example, two or more semiconductor elements may be stacked facing down on the circuit board, and two or more semiconductor elements may be stacked facing up on them.

The features and the advantages of the present invention may be summarized as follows.

According to one aspect of the invention, a lower semiconductor element is mounted facing down on an insulating circuit board, the element electrodes of the upper semiconductor element are connected to under-the-board electrodes through openings of the board, and the element electrodes of the upper semiconductor element are connected to on-the-board electrodes. By this, semiconductor elements of almost the same size can be stacked, and the length of loops for inner connection can be shortened.

In another aspect, another semiconductor element is stacked facing up on the upper semiconductor element of the invention as stated above, and the element electrode thereof are connected to on-the-board electrodes. By this, a number of semiconductor elements can be stacked, and the length of loops for inner connection can be shortened.

According to another aspect of the present invention, a relatively small semiconductor element is mounted facing down on the lower level of an insulating circuit board, a relatively large semiconductor element is mounted facing down on the upper level of an insulating circuit board, and the element electrodes of lower and upper semiconductor elements are connected to under-the-board electrodes through the openings of the board. By this, a plurality of semiconductor elements can be stacked, and the length of loops for inner connection can be shortened.

In another aspect, another semiconductor element is stacked facing up on the upper semiconductor element of the invention as stated above, and the element electrode thereof are connected to on-the-board electrodes. By this, a number of semiconductor elements can be stacked, and the length of loops for inner connection can be shortened.

In another aspect, a semiconductor element in any level of the invention as stated above is separated in the same level into two or more semiconductor elements. By this, a number of semiconductor elements can be stacked, and the length of loops for inner connection can be shortened.

In another aspect, a part of board electrodes are placed on the back surface of the circuit board inside the area of the semiconductor element of the lower level in the invention as stated above. By this, the wiring area of board electrodes (pins or balls) can be expanded, accommodating increase in the numbers of pins and balls.

In another aspect, board electrodes are placed on the back surface of the circuit board inside and outside the area of the semiconductor element in the invention as stated above, and these are interconnected with wires. By this, the wiring area of board electrodes (pins or balls) can be expanded, accommodating increase in the numbers of pins and balls.

In another aspect, board electrodes are placed on the back surface of the circuit board inside and outside the area of the semiconductor element of the lower level in the invention as stated above, and the element electrodes of the semiconductor element of the lower level are connected to both board electrodes. By this, the wiring area of board electrodes (pins or balls) can be expanded, accommodating increase in the numbers of pins and balls.

In another aspect, element electrodes of stacked semiconductor elements are directly electrically interconnected in the invention stated above. By this, the length of loops for inner connection can be shortened.

In another aspect, the encapsulation of semiconductor elements mounted on a circuit board, and the encapsulation of connecting parts on the back side of the board are formed collectively. By this, the productivity of semiconductor devices can be improved.

According to another aspect of the present invention, a lower semiconductor element is mounted facing down on an insulating circuit board, the element electrodes of the upper semiconductor element are connected to under-the-board electrodes through openings of the board, and the openings of the circuit board are formed in the circuit board to have predetermined shapes corresponding to the placement of element electrodes of the semiconductor elements. By this, the freedom of the placement and wiring of board electrodes (pins or balls) is increased, and the wiring area of board electrodes can be expanded, accommodating increase in the numbers of pins and balls.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2000-33791, filed on Feb. 10, 2000 including specification, claims, drawings and summary, on which the Convention priority of the present application is based, are incorporated herein by reference in its entirety.

What is claimed is:

1. A semiconductor device comprising:
   a circuit board having a top surface and a back surface on which board electrodes are arranged on said top and back surfaces and in which predetermined openings are formed; and
   a plurality of semiconductor elements each having a top surface and a back surface and in which element electrodes are arranged on said top surface,
   wherein:
     a first semiconductor element is placed so that the top surface thereof faces to the top surface of said circuit board, and the element electrodes thereof are connected to the board electrodes on the back surface of said circuit board with wires that pass through said openings of said circuit board; and
     a second semiconductor element is stacked so that the back surface thereof is joined to the back surface of said first semiconductor element, and the element electrodes thereof are connected to the board electrodes on the top surface of said circuit board.

2. The semiconductor device according to claim 1, wherein:
   the element electrodes of said first semiconductor element are placed at the end portion or the central portion of the first semiconductor element; and
   said openings of said circuit board are formed at locations facing to said element electrodes.

3. The semiconductor device according to claim 1, wherein:
   a third semiconductor element having dimensions smaller than the dimensions of said second semiconductor element is stacked so that the back surface thereof is joined to the top surface of said second semiconductor element; and
   the element electrodes thereof are connected to the board electrodes on the top surface of said circuit board.

4. The semiconductor device according to claim 3, wherein any of said first through third semiconductor elements is separated into two or more semiconductor elements and placed on the same layer.

5. The semiconductor device according to claim 1, wherein:
   a part of said board electrodes are placed on the back surface of said circuit board inside the area beneath said first semiconductor element; and
   the elements electrodes of said first semiconductor element are connected to the board electrodes in said area on the back surface of said circuit board through said openings of said circuit board.

6. The semiconductor device according to claim 1, wherein:
   said board electrodes are placed on the back surface of said circuit board inside and outside the area beneath said first semiconductor element;
   the elements electrodes of said first semiconductor element are connected to the board electrodes outside said area on the back surface of said circuit board through said openings of said circuit board; and
   the board electrodes outside said area are connected to the board electrodes inside said area with additional wires.

7. The semiconductor device according to claim 1, wherein:
   said board electrodes are placed on the back surface of said circuit board inside and outside the area beneath said first semiconductor element; and
   the elements electrodes of said first semiconductor element are connected to the board electrodes inside said area and to the board electrodes outside said area on the back surface of said circuit board through said openings of said circuit board.

8. The semiconductor device according to claim 3, wherein the element electrodes of any of said first through third semiconductor elements are directly electrically interconnected.

9. The semiconductor device according to claim 1, wherein a seal of said first semiconductor element on the top surface of said circuit board and a seal of a connecting part on the back surface thereof are integrally formed.

10. A semiconductor device comprising:
    a circuit board having a top surface and a back surface on which board electrodes are arranged on said top and back surfaces, and in which predetermined openings are formed; and a plurality of semiconductor elements each having a top surface and a back surface, and in which element electrodes are arranged on said top surface, wherein:

a first semiconductor element is placed so that the top surface thereof faces to the top surface of said circuit board, and the element electrodes thereof are connected to the board electrodes on the back surface of said circuit board with wires that pass through said openings of said circuit board; and a second semiconductor element having dimensions larger than the dimensions of said first semiconductor element is stacked so that the top surface thereof faces to the back surface of said first semiconductor element and the element electrodes thereof are out of the back surface of said first semiconductor element, and said element electrodes are connected to the board electrodes on the back surface of said circuit board through said openings of said circuit board.

11. The semiconductor device according to claim 10, wherein:

the element electrodes of said first semiconductor element are placed on the end portion or the central portion of the element; and an opening of said circuit board is formed at the location facing said element electrodes.

12. The semiconductor device according to claim 10, wherein:

a third semiconductor element is stacked so that the back surface thereof is joined to the back surface of said second semiconductor element; and the element electrodes thereof are connected to the board electrodes on the top surface of said circuit board.

13. A semiconductor device comprising:

a circuit board having board electrodes placed on the top and back surfaces thereof and having predetermined openings formed therein; and a semiconductor element having element electrodes placed on the top surface thereof, in which said semiconductor element is placed so that the element electrodes thereof face to the top surface of said circuit board, and said element electrodes are connected to the board electrodes placed on the back surface of said circuit board through said openings of said circuit board; and wherein said plurality of openings formed in said circuit board are formed in predetermined locations and have predetermined shapes corresponding to the arrangement of element electrodes of said semiconductor element.

14. The semiconductor device according to claim 13, wherein said opening of said circuit board is formed in a continuous single predetermined shape corresponding to the arrangement of element electrodes of said semiconductor element.

15. The semiconductor device according to claim 13, wherein said opening of said circuit board is formed in a substantially cross-shape or H-shape.

16. The semiconductor device according to claim 13, wherein wires passing through the gap between said plurality of openings are provided on the back surface of said circuit board.

17. The semiconductor device according to claim 13, wherein said plurality of openings are arranged so that more than one opening is placed along one side of said circuit board, and that the combination of said openings constitute a rectangular shape.

18. The semiconductor device according to claim 13, wherein said plurality of openings of said circuit board are arranged such that three or more openings are laterally arranged substantially in parallel to each other.

19. The semiconductor device according to claim 13, wherein each of said plurality of openings of said circuit board have an L-shape, and that the edges of said openings constitute a rectangular shape.

20. A semiconductor device comprising:

a circuit board having a top surface and a back surface on which board electrodes are arranged on said top and back surfaces and in which a predetermined opening is formed;

a plurality of semiconductor elements each having a top surface and a back surface and in which element electrodes are arranged on said top surface, wherein:

a first semiconductor element is placed so that the top surface thereof faces to the top surface of said circuit board, and the element electrodes thereof are connected to the board electrodes on the back surface of said circuit board with wires that pass through the opening of said circuit board;

a second semiconductor element is stacked so that the back surface thereof is joined to the back surface of said first semiconductor element, and the element electrodes thereof are connected to the board electrodes on the top surface of said circuit board; and said opening formed in said circuit board is formed in a predetermined location and to have a predetermined shape corresponding to the arrangement of element electrodes of said semiconductor element.

* * * * *

UNITED STATES PATENT AND TRADEMARK OFFICE
CERTIFICATE OF CORRECTION

PATENT NO. : 6,445,594 B1
DATED : September 3, 2002
INVENTOR(S) : Kazuyuki Nakagawa et al.

It is certified that error appears in the above-identified patent and that said Letters Patent is hereby corrected as shown below:

Drawings,
Sheet 6 of 8, Fig. 6A and 6A1, replace with Fig. 6A and 6A1 below:

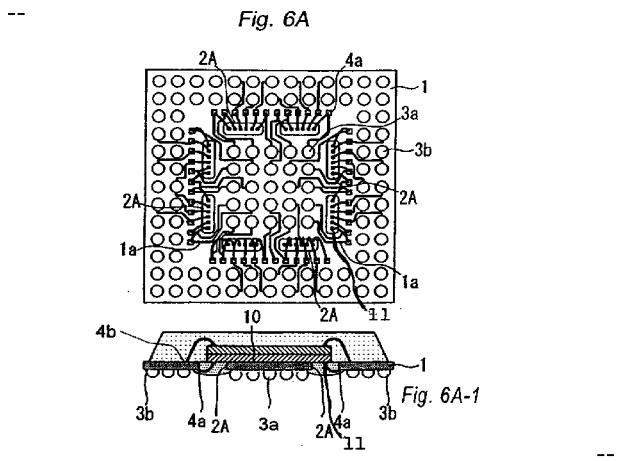

Column 11,
Line 32, reads "1a denotes wires provided ". In this phrase numeral reference "1a" is not printed in a bold type. Therefore, correction to bold type is needed.

Column 12,
Line 13, reads "wires 1a are provided". In this phrase too, numeral reference "1a" is not printed in a bold type. Therefore, correction to a bold type is needed.

UNITED STATES PATENT AND TRADEMARK OFFICE
CERTIFICATE OF CORRECTION

PATENT NO. : 6,445,594 B1
DATED : September 3, 2002
INVENTOR(S) : Kazuyuki Nakagawa et al.

It is certified that error appears in the above-identified patent and that said Letters Patent is hereby corrected as shown below:

<u>Column 13,</u>
Lines 13,14,15, read "By using such a insulating circuit board 1, the semiconductor device as shown in FIG. 1C, FIGS. 2A and 2C. Figs. 3A through 3D, FIGS. 4A and 4B, and FIG 5B". This phrase should be change to -- By using such an insulating circuit board 1, the semiconductor device as shown in FIGS, 1A and 1C, FIGS. 2A and 2C, FIGS. 3A through 3D, FIGS. 4A and 4B, and FIG 5B can be obtained --

Signed and Sealed this

Twenty-seventh Day of May, 2003

JAMES E. ROGAN
*Director of the United States Patent and Trademark Office*